United States Patent [19]

Armstrong et al.

[11] Patent Number: 4,724,325
[45] Date of Patent: Feb. 9, 1988

[54] ADHESION COOLING FOR AN ION IMPLANTATION SYSTEM

[75] Inventors: Allen E. Armstrong, Lexington; Victor M. Benveniste, Magnolia; David Edwards, Jr., Hamilton, all of Mass.

[73] Assignee: Eaton Corporation, Cleveland, Ohio

[21] Appl. No.: 855,191

[22] Filed: Apr. 23, 1986

[51] Int. Cl.$^4$ .............................................. H01J 37/20
[52] U.S. Cl. ............................ 250/443.1; 250/442.1; 250/492.2; 118/500; 118/730
[58] Field of Search ............ 250/492.21, 492.2, 492.3, 250/440.1, 441.1, 442.1, 443.1; 118/728, 729, 730, 732, 500; 427/38

[56] References Cited

U.S. PATENT DOCUMENTS

| | | | |
|---|---|---|---|
| 4,139,051 | 2/1979 | Jones et al. | 105/1 |
| 4,228,358 | 10/1980 | Ryding | 250/492.2 |
| 4,247,781 | 1/1981 | Bayer et al. | 250/492.2 |
| 4,282,924 | 8/1981 | Furetra | 165/80 E |
| 4,403,567 | 9/1983 | de Costa et al. | 118/500 |

FOREIGN PATENT DOCUMENTS

| | | | |
|---|---|---|---|
| 0178803 | 4/1986 | European Pat. Off. | 250/492.3 |
| 0142137 | 6/1980 | German Democratic Rep. | 118/500 |
| 0020428 | 2/1985 | Japan | 250/440.1 |
| 0136314 | 7/1985 | Japan | 118/730 |

Primary Examiner—Bruce C. Anderson
Assistant Examiner—Paul A. Guss
Attorney, Agent, or Firm—D. A. Rowe; F. M. Sajovec

[57] ABSTRACT

An ion beam treatment system for treating silicon wafers placed in the ion beam path. A rotatably mounted wafer pedestal has a plurality of wafer supporting substrates spaced about the pedestal. The substrates are constructed from an elastomer that is chosen for its ability to transfer heat generated by ion collision with the wafers away from the wafers. Each wafer substrate defines a series of elongated depressions across its surface. Certain of these depressions are connected to a pressure source at a wafer loading/unloading station to help acquire the wafers during loading and to facilitate removal of the wafers during unloading. Other depressions vent the interface between the wafers and the substrate to atmosphere to avoid undue pressure build-up on the wafers as they lift off the substrate.

16 Claims, 8 Drawing Figures

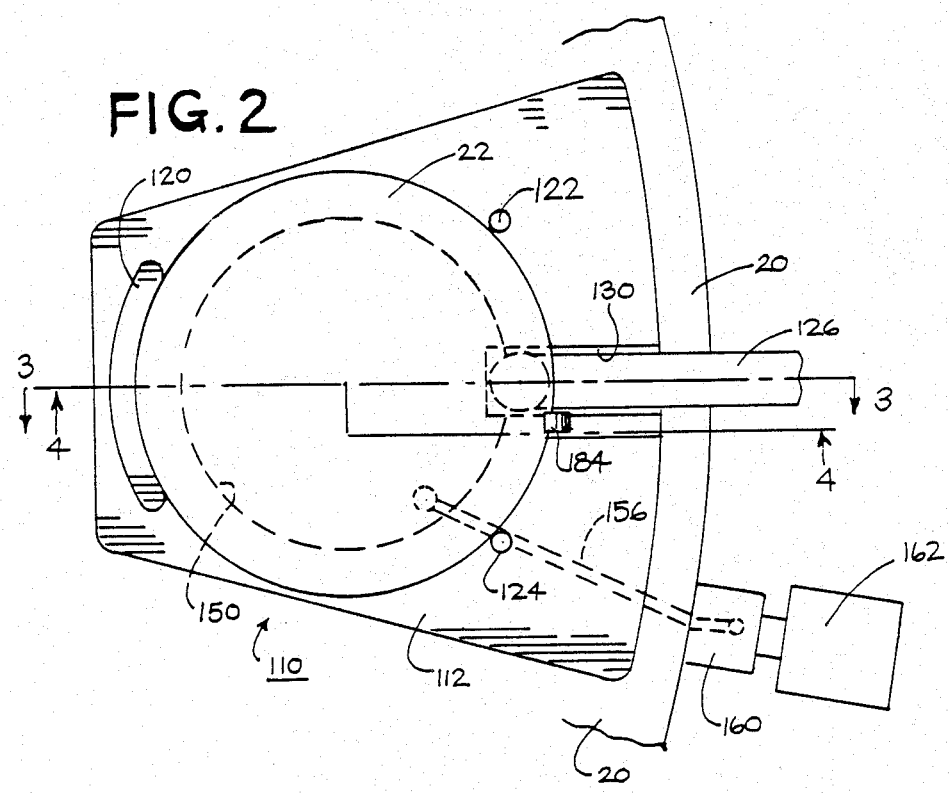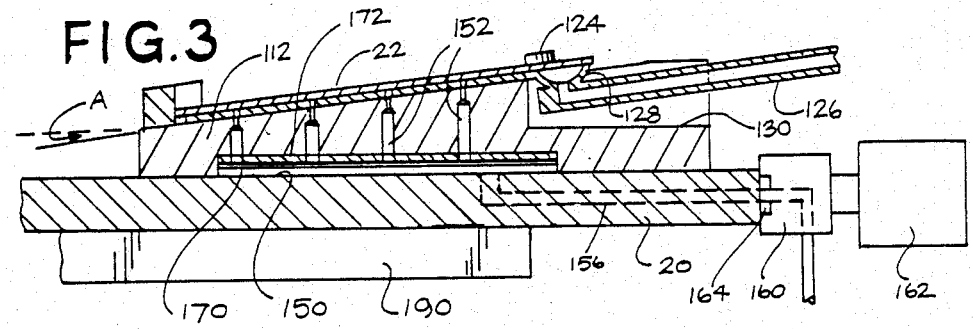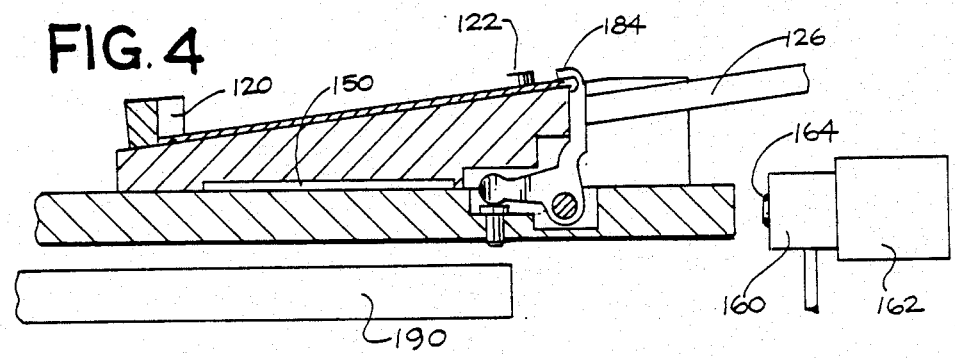

ADHESION COOLING FOR AN ION IMPLANTATION SYSTEM

TECHNICAL FIELD

The present invention relates to method and apparatus for positioning a workpiece in a particle beam path to provide adequate cooling of the workpiece during beam treatment. A preferred process is used in conjunction with an ion implantation system for doping semiconductor materials.

BACKGROUND ART

One procedure for doping silicon materials with impurities to produce a semiconductor is to bombard silicon wafers with an ion beam. Controlled concentrations of ions strike the wafer and dope the wafer to a particular impurity concentration. Systems for ion doping of semiconductor materials are described in U.S. Pat. Nos. 4,228,358 to Ryding and 4,234,797, also to Ryding. The disclosure of these prior art patents are incorporated herein by reference.

The systems disclosed in these patents employ specifically constructed ion doping chambers. Controlled intensity ion beams are generated and directed to impinge upon a spinning support structure carrying a plurality of wafers about its circumference. By controlled movements of the wafer support, controlled ion doping concentrations of the wafers are achieved.

As described in the '358 patent to Ryding, the prior art systems include a loading station where semiconductor wafers are mounted to a disk-like support for transfer to the ion implantation chamber. Once a specified concentration of doping has taken place, the disk-like support is returned to the loading-unloading station and those wafers already doped are unloaded to make room on the wafer support for undoped wafers.

In these doping systems kinetic energy is transferred from the ion beam to the wafer in the form of heat. If this heat is dissipated during ion implantation desired doping levels can be achieved at a greater rate. One way to dissipate heat build up in the wafers is to make sure the wafers contact the wafer support across the entire wafer surface. Two prior art patents addressing the heat dissipation problem are U.S. Pat. Nos. 4,139,051 to Jones et al. and 4,403,567 to daCosta et al. These two patents disclose a semiconductor material mounting procedure where adhesion between the material and a support is maintained by means of a vacuum.

Experience with prior art vacuum hold down procedures, however, has resulted in some difficulty in transferring semiconductor wafers to and from their support. In particular, nonuniform pressure conditions on the surface of the wafer can lead to breaking of the wafer. This can be caused either through excessive forces exerted on the semiconductor wafer or, nonuniform action of the pressure as the wafer is being removed from the support.

DISCLOSURE OF THE INVENTION

The present invention provides method and apparatus to load and unload wafer materials from a wafer support. Heat transfer away from the wafer to the support during beam treatment is enhanced. The preferred use of the invention is in conjunction with a semiconductor doping system that uses an ion beam to impinge upon silicon wafers moving with respect to the beam in a controlled way that produces desired doping levels.

In accordance with a preferred design, a plurality of elastomer substrates are connected to a wafer support to define a number of wafer mounting positions. The support is moved to an ion implantation chamber and rotated through the ion beam to dope the silicon wafers mounted to the elastomer substrates. During rotation the substrates exert a centripetal force on the wafers that insures adequate heat transfer from the wafer to the substrate. Heat transfer from the wafer to the substrate is enhanced by increasing the contact area between the wafer and the substrate by providing a substrate with an outer wafer-contacting surface molded so as to be essentially optically flat. Such a substrate is fabricated by lapping the mold surface flat to about one quarter wavelength of the light.

Each substrate defines a first set of elongated depressions extending transversely across the elastomer material surface and a second set of elongated depressions extending from an interior region of the elastomer material to an edge of the material. During wafer loading and unloading the first set of depressions are coupled to a pressure source that raises and lowers the pressure within the first set of depressions. During wafer loading, the pressure in these depressions is lowered to exert a force of attraction between the substrate and the wafer. After the wafers have been mounted, the preferred mounting support is moved away from a loading/unloading station to an evacuated chamber for ion beam treatment.

Once ion beam treatment has been accomplished, the support and accompanying wafers are returned to the loading/unloading station so that the treated wafers can be removed and a subsequent set of untreated wafers loaded for treatment. During the unloading step, pressure within the first set of elongated depressions in the elastomer mounting surface is raised so that the semiconductor wafers are pushed away from the elastomer mounting surface. As this is being done, the second set of elongated depressions extending from the edge of the mounting surface to its interior vents the interface between wafer and support substrate to atmosphere. This venting to atmosphere reduces the forces experienced by the wafer during the unloading process. This venting is also necessary to overcome the increased adhesion forces between the wafer and the substrate caused by the increased contact area provided to enhance heat transfer.

In the preferred design, the depressions defined by the elastomer material are coupled to a source of pressure through conduits in the wafer support leading through the support to the one or more wafer mounted positions.

During the unloading and loading process, the support rests against a heat sink to dissipate heat that has been transferred to the support. Contact between the support and the heat sink causes a latching mechanism to pivot away from the semiconductor wafers so they can be removed from their elastomer support substrates. A flexible contact cup is used to acquire each wafer and remove it from the support. Once all wafers have been removed in this manner, untreated wafers are loaded.

It is appreciated that one object of the invention is method and apparatus for mounting semiconductor wafers to achieve adequate cooling of the wafer during ion beam treatment of the wafer. This is accomplished in a way that minimizes damage to the wafer during loading and unloading of the wafers. These and other objects, advantages and features of the invention will become better understood when a detailed description of a preferred embodiment of the invention is described in conjunction with the accompanying drawings.

BRIEF DESCRIPTION OF THE DRAWINGS

FIG. 2 is a plan view of a portion of a wafer support showing a wafer at one of a number of wafer mounting positions;

FIG. 3 is a section view taken along the line 3—3 in FIG. 2;

FIG. 4 is a section view taken along the line 4—4 in FIG. 2;

BEST MODE FOR CARRYING OUT THE INVENTION

Figure 1:
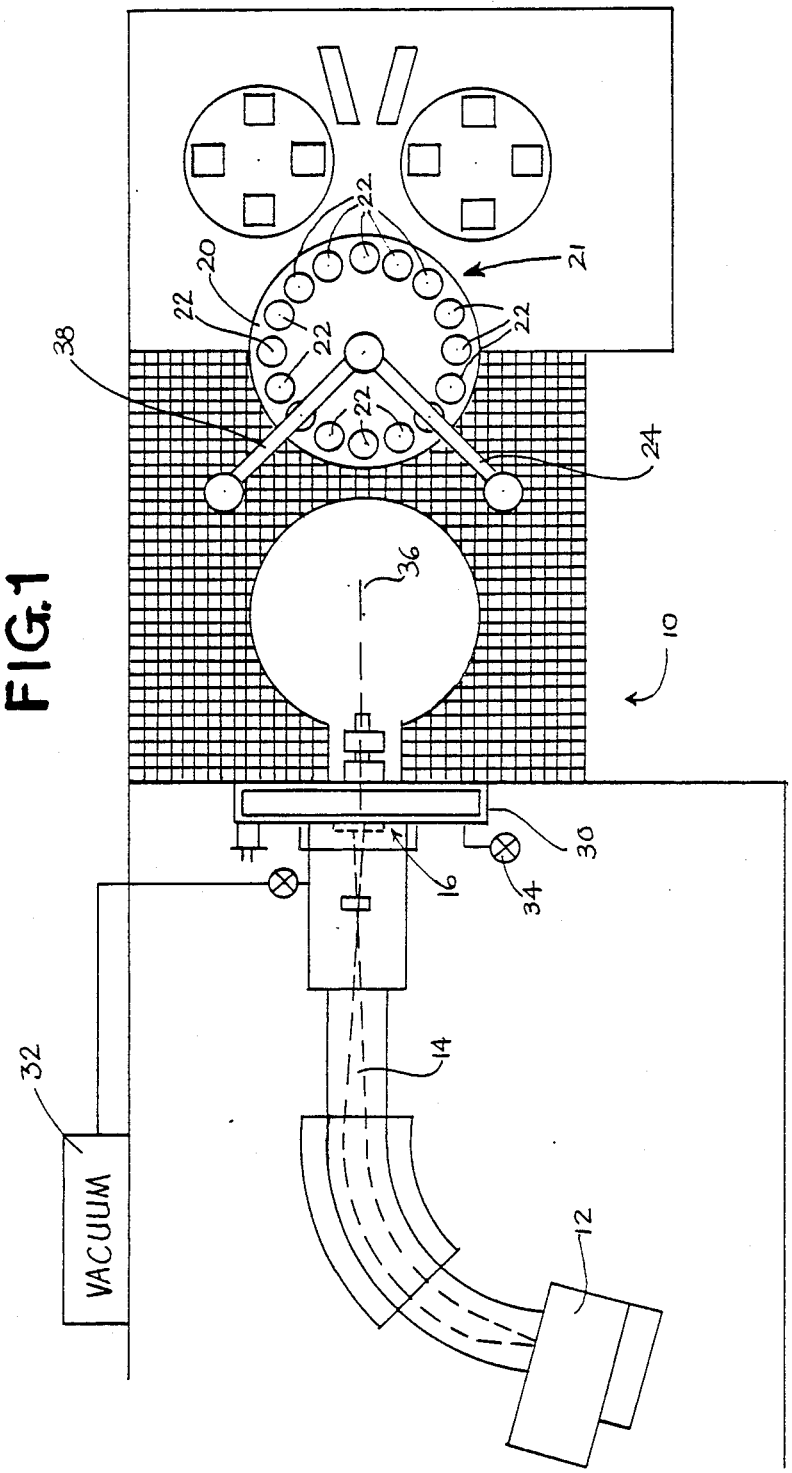
FIG. 1 is a schematic of an ion beam treatment system having a rotating wafer support for moving wafers through the ion beam.

Turning now to the drawings, FIG. 1 presents an overview of an ion implantation system 10 where an ion source 12 directs an ion beam 14 to an ion implantation or target station 16.

A wafer support 20 is shown at a loading and unloading station 21 where a plurality of silicon wafers 22 are moved to the supports 20 prior to treatment. Once all wafers 22 are mounted to the support, a loading arm 24 transfers the support 20 and accompanying wafers 22 to the target station 16 where the support 20 is tilted out of the horizontal plane to a vertical orientation. At the target station 16 the support and wafers are vertically oriented within an ion implantation chamber 30 whose pressure can be controlled by a vacuum source 32. In addition, the chamber 30 can be vented to atmosphere by a vent valve 34 that pressurizes the chamber and allows the support 20 to be inserted and withdrawn from the chamber 30.

Within the chamber, the support 20 is mounted for rotation about a center axis 36. Rotation of the support 20 within the chamber 30 causes the wafers 22 to rotate through the ion beam 14 to achieve a selected doping concentration. In a preferred ion implantation system, the support 20 can be both translated and rotated. Through combinations of these movements, controlled doping levels of each wafer 22 mounted about the periphery of the support 20 is accomplished.

Additional details regarding the doping procedure as well as movement of the support 20 into and out of the chamber 30 are disclosed in the aforementioned and incorporated two patents to Ryding.

Once ion implantation has been accomplished in accordance with the procedures described in these prior art patents, the support 20 and accompanying wafers 22 are withdrawn from the chamber 30 and moved to the loading and unloading station 21 by a second support arm 38 where the doped wafers 22 are unloaded from the support 20.

Once this is accomplished, additional undoped wafers 22 are loaded onto the support 20 and the process of moving the wafers and support to the ion implantation target station 16 repeated.

The wafers 22 are silicon and can be damaged rather easily. Contact with one's hand, for example, introduces unacceptable levels of impurities. Undue bending or uneven forces exerted on the wafers can easily break the wafer.

A particular problem encountered in the prior art is how to efficiently and safely load and unload the wafers while assuring adequate adhesion between the wafer 22 and the support 20 during ion implantation.

Turning now to FIGS. 2-4, a single wafer support station 110 is shown located near a periphery of the support 20. The wafer support station 110 includes a pedestal support 112 that defines a support surface tilted with respect to the plane of the support 20 to form an angle A (FIG. 2) (approximately 7 degrees) with respect to that plane. The pedestal support 112 supports three spaced guides or gates 120, 122, 124 that bound the wafer 22 once it is placed on the pedestal support 112.

The wafer 22 is both deposited and retrieved from the wafer support station 110 by a vacuum probe 126 having a flexible cup 128 at its end for engaging the wafer 20. To allow the flexible cup 128 to come in contact with a bottom surface of the wafer 20, the pedestal 112 defines a notch or groove 130 allowing the probe 126 to access an outer surface of the wafer 20.

Figure 5:
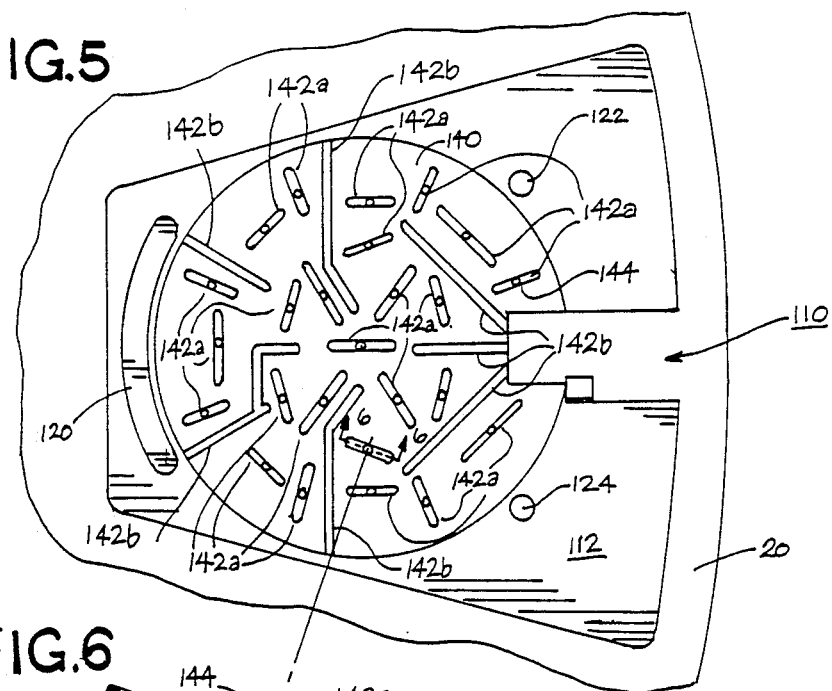
FIG. 5 is a plan view of a wafer mounting position with a wafer removed to show a wafer mounting substrate.

FIG. 5 shows the FIG. 2 wafer support station 110 with the wafer removed. Each wafer 22 is supported by a circular elastomer substrate 140 affixed to the pedestal support 112. The elastomer substrate 140 is preferably constructed from silicone having two sets of narrow, interspersed depressions or grooves 142a, 142b uniformly spaced across the substrate outer surface. Wafer adhesion to and removal from the elastomer substrate is facilitated by these depressions 142a, 142b. Wafer adhesion is further facilitated by surface adhesion of the wafer to the elastomer substrate. Surface adhesion is promoted by interaction of the wafer with the essentially optically flat outer surface of the substrate.

Each of the depressions 142a forms an elongated groove extending across an innersurface of the substrate. At a center point of each of the depressions 142a, an opening 144 extends from a bottom surface of the depression through the substrate 140. This hole or aperture 144 allows the depressions 142a to be partially evacuated during wafer acquisition and to be pressurized as the wafer is removed from the pedestal 112. Pressurization is necessary to overcome the increased adhesive forces between the wafer and the elastomer substrate caused by the interaction of the wafer with the optically flat outer surface of the substrate.

Figure 6:
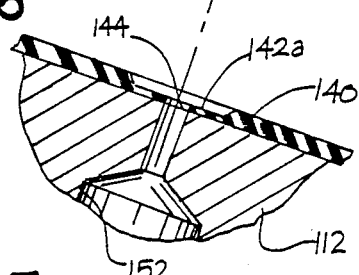
FIG. 6 is an enlarged section view of a wafer substrate taken along the line 6—6 in FIG. 5.

As seen most clearly in FIGS. 3 and 6, the apertures 144 in the elastomer substrate 140 are in fluid communication with a cavity 150 via conduits 152 that narrow at one end to the same diameter as the apertures 144 at the bottom of the depressions 142a. In the FIG. 3 embodiment, the wafer 22 is shown adhering to the elastomer substrate 140 due to the force of attraction exerted by the evacuated depressions 142a.

To achieve this suction the cavity 150 is coupled to a pressure conduit 156 extending radially outward from the cavity through the support 20 to an outside surface of the support. The pressure in the conduit 156 is reduced by a vacuum suction source (not shown) coupled to the conduit 156 by a movable coupling 160 that is moved into and out of engagement with the support 20 by a actuator 162. An O-ring seal 164 carried by the coupling 160 maintains fluid tight engagement between the coupling 160 and the support 20.

During unloading of the wafer, the pressure source pressurizes the cavity 150 to aid in separating a doped wafer 20 from the elastomer substrate 140. The cavity 150 is bounded by a gas flow restrictor disk 170, fabricated of sintered porous metal, as produced, for example, by Mott Metalurgical Company of Farmington, CT, and a gasket 172 that isolates the conduits 152 from each other during pressurization of the depressions. This fluid isolation prevents depressurization of all the depressions 142a as the wafer lifts off the substrate. Were it not for this pressure isolation the cavity 150 would be vented to atmosphere thereby depressurizing those depressions 142a still covered by the wafer 22.

Returing to FIG. 5, the second set of depressions 142b formed in the substrate 140 connect an edge of the substrate to its interior and admit air at atmosphere pressure to the interface between the wafer 22 and the elastomer substrate 140. This admission of atmospheric pressure prevents pressure from building up in the interior of the wafer while the outer circumference of the wafer still adheres to the elastomer substrate. Without such venting depressions 142b, efforts to remove wafers from the substrate have resulted in breaking the wafer before separation between the wafer and the elastomer is achieved.

Figure 7:
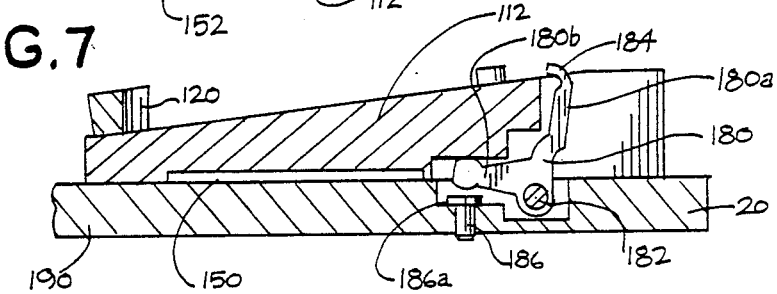
FIGS. 7 and 8 are section views of the waffer support showing the operation of a wafer latching member.
Figure 8:
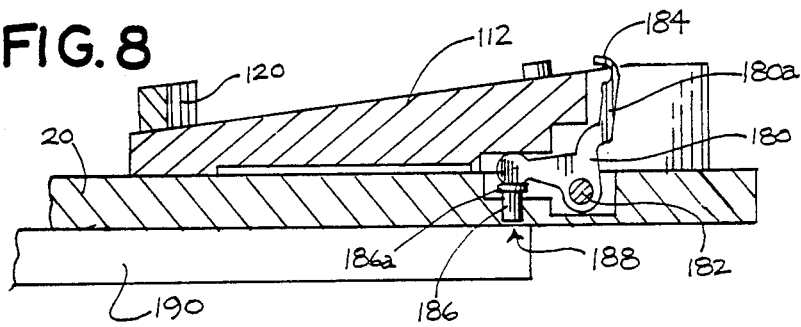

The adhesion between wafer and elastomer substrate achieved by sucking the wafer into contact with the substrate is not always sufficient to retain the wafer during tilting of the support 20 to the vertical position for implant. Redundant retention is provided by a retaining device 180 illustrated in FIGS. 4, 7, and 8. The retaining device 180 is pivotally mounted to the support 20 to rotate about an axis of rotation 182 and is biased in a counterclockwise direction by a spring (not shown). The retaining device 180 has two arms 180a, 180b extending radially away from the pivot 182. At an outer most end of the first arm 180a the retaining member 180 defines a latch 184 for holding the wafer should it become detached from the substrate. The second arm 180b engages a pin 186 having a shoulder 186a to hold the pin in sliding engagement within an aperture 188 in the support 20. The latching member is biased into engagement with the wafer 22 (FIG. 4) as the support 20 is being moved from the loading/unloading station 21 to the implantation station 16. During ion implantation (FIG. 7), the support 20 is spinning about a center axis and the latch 184 rotates about its pivot axis 182 to expose the entire wafer to ion beam impingement.

At the loading/unloading station, the latching member 180 is also pivoted out of engagement with the wafer by the pin 186 exerting a pivoting action against the arm 180b. The pin extends beneath a bottom surface of the support 20 so that when the support 20 is positioned on a heat sink 190 at the loading/unloading station 21, the pin exerts an upward force against the arm 180b to rotate the latch 184 away from an associated wafer so it can be removed from its wafer support substrate 140.

During implantation, the tilted surface of the pedestal 112 causes the wafer 20 to press against a substrate 140 due to the centrifugal force exerted on the wafer during rotation of the support. The guides 122, 124 prevent the wafer from moving radially outward away from the substrate so the pivoting away of the latch 184 once the disk is rotating with a sufficient speed does not affect heat transfer across the wafer/substrate interface.

The silicone substrate 140 is typically 0.04 centimeters thick and has a bulk thermoconductivity of 2.9 milliwatts per centimeter-degree Celsius. In addition to using an optically flat mold surface to mold this substrate, the substrate surface supporting the wafer is implanted with argon at a dose of 1E14 ions/square centimeter at energies of 5 kev to optimize surface tack. Vacuum deposited aluminum also serves this function. A contact pressure between wafer and substrate of 0.06 pounds per square inch can be achieved if the support 20 having a diameter of 25 inches is rotated with a speed of 950 revolutions per minute. This pressure produces a contact conductance between wafer and substrate of 50 milliwatts per square centimeter-degree Celsius. At maximum beam power of 1600 watts for a preferred ion implantation system, the average power density of 915 milliwatts per square centimeter and conductance of 50 milliwatts per square centimeter degree celsius results in an average temperature difference across the substrate 140° of about 19° Celsius.

The peak temperature drop across the substrate is higher than the average, on the order of 45° C., because instantaneous power density, determined by ion beam shape and scanning rate, is higher than the average beam power.

Heat conducted through the substrate is stored in the thermal mass of the support 20 as a gradually increasing temperature. If the support is at room temperature at the beginning of implant, the wafer temperature will reach 90° C. at the end of a typical implant. To ensure that the support returns to room temperature between implants, it is brought into contact with the heat sink 190, a water-cooled aluminum disk similar in diameter to the support, during loading/unloading at station 21.

The disclosed ion implantation wafer mounting system has been described with a degree of particularity. It is the intent, however, that the invention encompass all modifications and alterations from the disclosed embodiment falling within the spirit or scope of the appended claims.

We claim:

1. Apparatus for positioning one or more flat wafers of material in a particle beam path to treat the wafers comprising:

support means for supporting one or more wafers in the beam path;

adhesion means connected to the support means to define one or more wafer mounting positions, said adhesion means including a layer of elastomer material defining a wafer support surface at each mounting position having a first set of elongated depressions extending transversely across the wafer support surface and a second set of elongated depressions extending from an interior region of said wafer support surface to an exposed region of the elastomer material;

heat sink means for dissipating heat transferred to the support means during beam treatment of said wafers; and loading means for moving wafers to and from one or more wafer mounting positions;

said support means defining conduit paths in fluid communication with said first set of elongated depressions to lower and raise the pressure in said first set of elongated depressions to attract an associated wafer to the adhesion means as the wafer is moved onto the support means and to repel an associated wafer from the adhesion means as the wafer is moved away from the support means.

2. The apparatus of claim 1 where the support means defines a chamber in fluid communication with a controlled fluid pressure source and said conduit paths lead from the chamber to the first set of elongated depressions in the elastomer material.

3. The apparatus of claim 2 additionally comprising means to selectively couple the controlled pressure source to the chamber.

4. The apparatus of claim 1 where both said one or more flat wafers and the wafer support surface are generally circular and the first set of elongated depressions extend both radially across said wafer support surface and transversely to a radial direction to cause uniform attraction and deflection of a wafer to and from an associated wafer support surface.

5. The apparatus of claim 4 where the second set of elongated depressions extend from an exposed edge of said elastomer material to a center region of said wafer support surface to vent regions of each wafer to atmosphere.

6. The apparatus of claim 1 where the wafer support surface of said thin layer of elastomer material is optically flat to increase the contact area between the wafer and the elastomer material.

7. A method for treating one or more wafers comprising the steps of:
affixing a thin elastomer substrate at one or more locations on a support pedestal, said elastomer substrate defining a wafer support surface having a first set of elongated depressions extending uniformly across an interior portion of the support surface, said elastomer substrate further defining a second set of elongated depressions extending from an exposed portion of the elastomer substrate to said interior portion of the wafer support surface;
moving one or more wafers to the one or more locations and attracting each wafer to an associated elastomer substrate by evacuating the first set of elongated depressions for each substrate;
treating the one or more wafers by directing an ion beam to impinge upon said wafers; and
subsequent to the treating step, separating the one or more wafers from their associated substrates by pressurizing the first set of elongated depressions while the second set of elongated depressions vent regions of an interface between a wafer and its associated elastomer substrate to atmosphere.

8. The method of claim 7 where during the separating step the pressure within individual elongated depressions of said first set is separated from others of said elongated depressions in said first set to avoid depressurizations when certain ones of said depressions are vented to atmosphere as the wafer separates from the elastomer substrate.

9. The method of claim 7 where the wafer support surface of said elastomer substrate is optically flat to increase the contact area between the wafer and the elastomer substrate.

10. Apparatus for use in a beam treatment system comprising:
a base member for supporting one or more wafers for movement through a beam in a controlled manner to treat said wafers; and
one or more generally planar wafer mounting substrates secured to a beam treatment surface of the base member to face the ion beam during beam treatment of the wafers; said wafer mounting substrates constructed from an elastomer material and defining a first set of depressions extending across a wafer support surface of each substrate for attracting a wafer to an associated substrate prior to beam treatment and for repelling said wafer from the associated substrate subsequent to beam treatment, said wafer mounting substrates defining a second set of depressions extending across said wafer support surface to an exposed region of each substrate for venting an interface between a substrate and an associated wafer to atmosphere as the wafer is separated from said substrate subsequent to beam treatment;
said base member defining conduit paths in fluid communication with said first set of depressions to lower and raise the fluid pressure in said first set of depressions to attract and repel wafers to and from said wafer mounting substrates.

11. The wafer support of claim 10 where the base member is generally circular, the plurality of planar wafer mounting substrates are spaced at wafer mounting positions about a periphery of the base member and inclined toward a center axis of said base member, and the base member is rotated about a center axis during beam treatment.

12. The wafer support of claim 11 further comprising retaining means pivotally mounted to said base member at each of said plurality of wafer mounting positions to hold said wafers in place until said base member is rotated with sufficient speed to cause said retaining means to pivot away from the wafers and expose an entire wafer surface for beam treatment of the wafer.

13. The apparatus of claim 10 where the elastomer material is silicone rubber.

14. The apparatus of claim 10 where the base member defines a pressure cavity beneath each mounting substrate in fluid communication with said first set of depressions through conduits isolated from each other to maintain pressure in depressions covered by a wafer as the wafer lifts off others of said depressions, said base member further defining a conduit leading from said pressure cavity to a controlled source of pressure.

15. A method for fabricating a silicone rubber semiconductor wafer support in a mold, said wafer support for use in an ion beam treatment system comprising the steps of:
lapping a mold surface until said surface is flat to within one quarter wavelength of light;
molding the silicone rubber elastomer support in said mold so as to form a wafer support surface on said mold surface; and
treating the wafer support surface with an impurity to control the tackiness of said wafer support surface by implanting said wafer support surface with argon.

16. A method for fabricating a silicone rubber semiconductor wafer support in a mold, said wafer support for use in an ion beam treatment system comprising the steps of:
lapping a mold surface until said surface is flat to within one quarter wavelength of light;
molding elastomer support in said mold so as to form a wafer support surface on said mold surface; and
treating the wafer support surface with an impurity to control the tackiness of said wafer support surface by vacuum depositing aluminum onto said wafer support surface.

* * * * *